(12) United States Patent
Singh et al.

(10) Patent No.: US 10,699,961 B2
(45) Date of Patent: Jun. 30, 2020

(54) ISOLATION TECHNIQUES FOR HIGH-VOLTAGE DEVICE STRUCTURES

(71) Applicant: GLOBALFOUNDRIES Inc., Grand Cayman (KY)

(72) Inventors: Jagar Singh, Clifton Park, NY (US); Edward J. Nowak, Shelburne, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/030,243

(22) Filed: Jul. 9, 2018

(65) Prior Publication Data

US 2020/0013679 A1 Jan. 9, 2020

(51) Int. Cl.
*H01L 21/8234* (2006.01)
*H01L 29/10* (2006.01)
(Continued)

(52) U.S. Cl.
CPC ........ *H01L 21/823481* (2013.01); *H01L 21/26513* (2013.01); *H01L 21/76224* (2013.01); *H01L 21/823431* (2013.01); *H01L 21/823493* (2013.01); *H01L 27/088* (2013.01); *H01L 27/0886* (2013.01); *H01L 29/0649* (2013.01); *H01L 29/1095* (2013.01);
(Continued)

(58) Field of Classification Search
CPC ....... H01L 21/823481; H01L 21/26513; H01L 21/76224; H01L 21/823431; H01L 21/823493; H01L 27/088; H01L 27/0886; H01L 29/0649; H01L 29/1095; H01L 21/02164; H01L 21/02271; H01L 21/266; H01L 21/31053; H01L 21/823475
See application file for complete search history.

(56) References Cited

U.S. PATENT DOCUMENTS 7,053,718 B2  5/2006  Dupuis et al.
8,288,829 B2  10/2012  Zhang et al.
(Continued)

FOREIGN PATENT DOCUMENTS

WO  2005031965 A2  4/2005
WO  2008133620 A1  11/2008

OTHER PUBLICATIONS

Wagner, "RF Technologies in self-driving cars", retrieved from the internet at https://silverstone-park.com/wp-content/uploads/2015/03/AutoSIG_AutonomousVehicles_02.12.14_ChristophWagner_RFTechnologies.pdf, Dec. 2, 2014.
(Continued)

*Primary Examiner* — Peter Bradford
(74) *Attorney, Agent, or Firm* — Thompson Hine LLP; Anthony Canale

(57) ABSTRACT

Structures for switches and methods for forming structures that include a switch. A first well and a section well are arranged in a substrate. Trench isolation regions are arranged in the substrate to define multiple active device regions. Each of the active device regions includes a section of the first well that is surrounded by the trench isolation regions. The second well has an opposite conductivity type from the first well. The active device regions and the trench isolation regions are arranged between the top surface of the substrate and the second well, and the second well is contiguous with the trench isolation regions.

20 Claims, 6 Drawing Sheets

(51) Int. Cl.
*H01L 29/06* (2006.01)
*H01L 27/088* (2006.01)
*H01L 21/762* (2006.01)
*H01L 21/265* (2006.01)
*H01L 21/266* (2006.01)
*H01L 21/02* (2006.01)
*H01L 21/3105* (2006.01)

(52) U.S. Cl.
CPC .. *H01L 21/02164* (2013.01); *H01L 21/02271* (2013.01); *H01L 21/266* (2013.01); *H01L 21/31053* (2013.01); *H01L 21/823475* (2013.01)

(56) References Cited

U.S. PATENT DOCUMENTS

| | | | | |
|---|---|---|---|---|
| 2008/0145987 | A1* | 6/2008 | Shima | H01L 21/268 |
| | | | | 438/293 |
| 2008/0197408 | A1* | 8/2008 | Disney | H01L 29/7811 |
| | | | | 257/335 |
| 2011/0201171 | A1* | 8/2011 | Disney | H01L 21/76243 |
| | | | | 438/404 |
| 2015/0236022 | A1* | 8/2015 | Oyu | H01L 27/10876 |
| | | | | 257/306 |
| 2016/0093624 | A1* | 3/2016 | Luan | H01L 27/1027 |
| | | | | 257/133 |
| 2018/0315864 | A1* | 11/2018 | Li | H01L 29/94 |
| 2018/0323187 | A1* | 11/2018 | Moen | H01L 27/0623 |

OTHER PUBLICATIONS

Dean Takahashi, "Why Intel believes 5G wireless will make autonomous cars smarter", Venture Beat, May 20, 2017.

Ohnakado et al., "21.5-dBm Power-Handling 5-GHz Transmit/Receive CMOS Switch Realized by Voltage Division Effect of Stacked Transistor Configuration With Depletion-Layer-Extended Transistors (DETs)", IEEE Journal of Solid-State Circuits, vol. 39, No. 4, Apr. 2004.

Li et al., "Flipping the CMOS Switch", IEEE Microwave Magazine, Feb. 2010.

* cited by examiner

ISOLATION TECHNIQUES FOR HIGH-VOLTAGE DEVICE STRUCTURES

BACKGROUND

The present invention relates to semiconductor device fabrication and integrated circuits and, more specifically, to structures for switches and methods for forming structures that include a switch.

Complementary metal-oxide semiconductor (CMOS) circuitry is utilized in mobile communication devices (e.g., laptops, cellular phones, tablets, etc.) to handle wireless high frequency signals transmitted to and/or received by the mobile communication devices. The circuitry may include a low noise amplifier and a high frequency switch that allows for high frequency signals received by an antenna to be routed from the low noise amplifier to other chip circuitry and for high frequency signals to be routed from a power amplifier to the antenna. The high frequency switch may include a stack or bank of field-effect transistors formed by CMOS processes. Field-effect transistors fabricated on a bulk wafer may exhibit poor linearity due to, for example, non-linear electric fields on the substrate and poor intermodulation properties. Semiconductor-on-insulator (SOI) wafers may mitigate some of these issues, but are costly in comparison with bulk wafers.

The field-effect transistors of a high-voltage switch may be stacked to withstand the switching of voltages that are greater than the breakdown voltages of the individual field-effect transistors. The field-effect transistors of a high-voltage switch fabricated using the device layer of an SOI wafer are isolated by the buried oxide layer from the substrate. However, such electrical isolation is absent when the stacked field-effect transistors of a high-voltage switch are fabricated using a bulk wafer.

Improved structures for switches and methods for forming structures that include a switch are needed.

SUMMARY

In an embodiment of the invention, a structure includes a first well in a substrate, a second well in the substrate, a plurality of trench isolation regions in the substrate, and a plurality of active device regions. Each of the active device regions includes a section of the first well surrounded by the trench isolation regions. The second well has an opposite conductivity type from the first well. The active device regions and the trench isolation regions are arranged between the top surface of the substrate and the second well, and the second well is contiguous with the trench isolation regions.

In an embodiment of the invention, a method includes forming a first well in a substrate, and forming a plurality of the trench isolation regions in the substrate. After forming the trench isolation regions in the substrate, the substrate is implanted with ions to form a second well having an opposite conductivity type from the first well. The trench isolation regions surround a plurality of active device regions each including a section of the first well. The active device regions and the trench isolation regions are arranged between the top surface of the substrate and the second well. The second well is contiguous with the shallow trench isolation regions.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
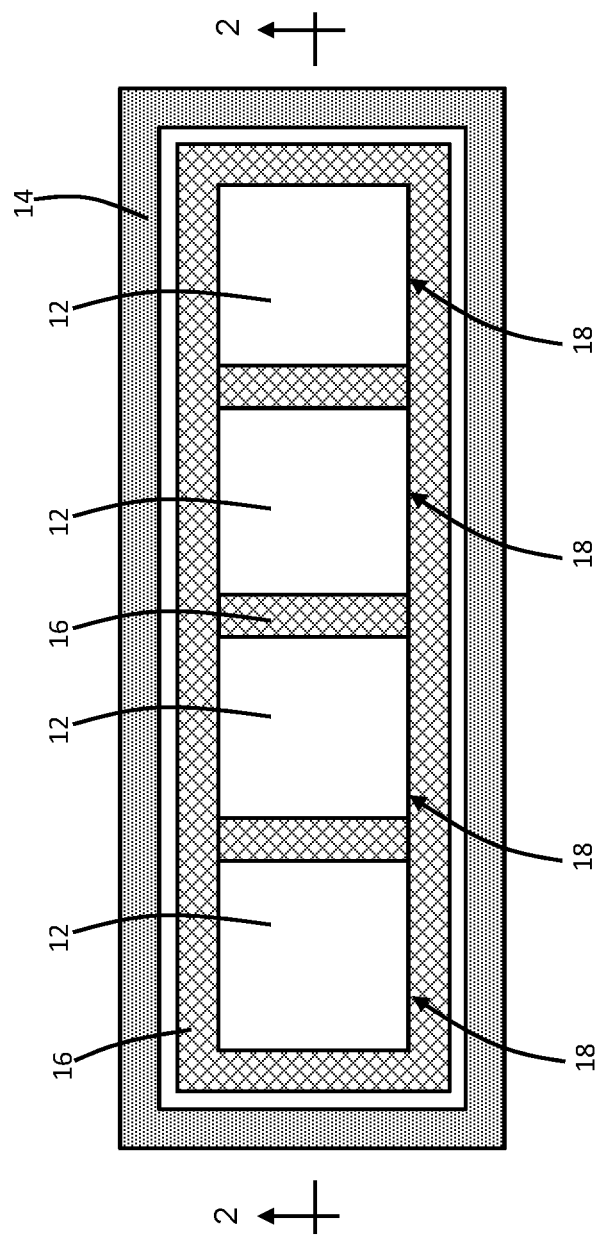
FIG. 1 is a top view of a structure at an initial stage of a processing method in accordance with embodiments of the invention.
Figure 2:
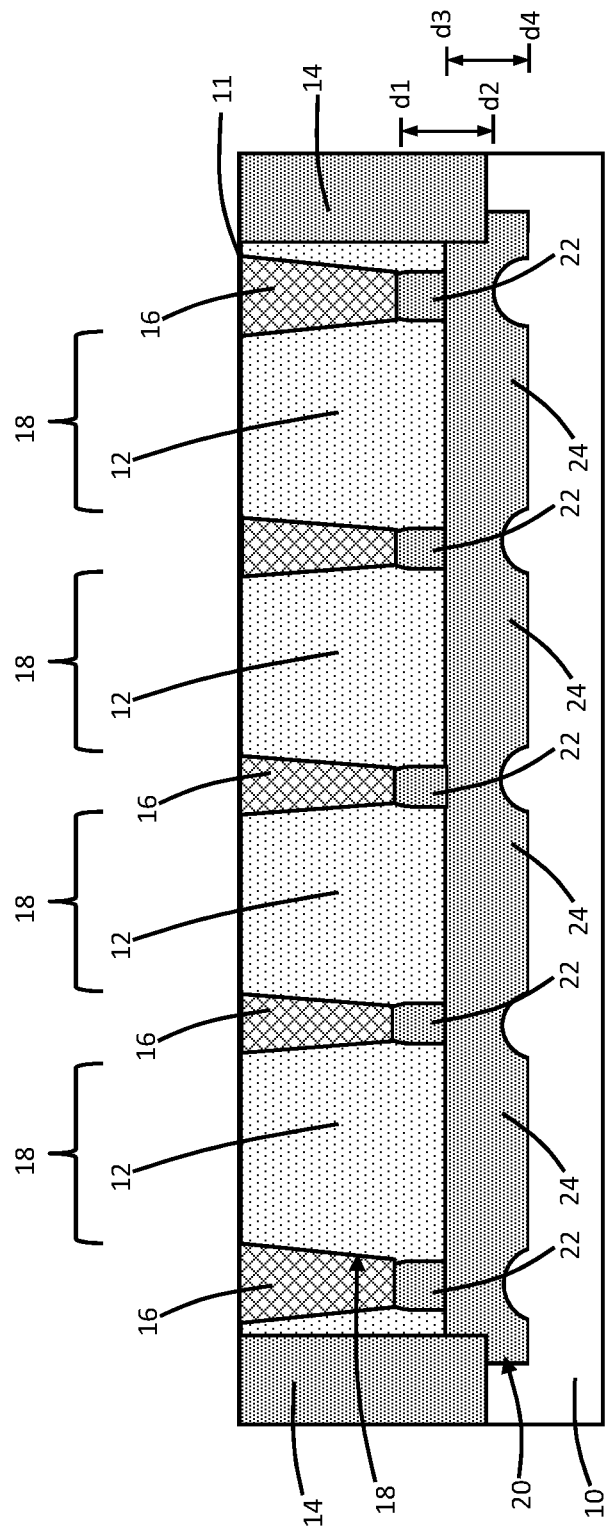
FIG. 2 is a cross-sectional view taken generally along line 2-2 in FIG. 1.

With reference to FIGS. 1, 2 and in accordance with an embodiment of the invention, a semiconductor substrate 10 includes a well 12 and a well ring 14 that surrounds the well 12. The semiconductor substrate 10 may be a bulk wafer composed of single-crystal silicon and may be lightly doped to have a given conductivity type, such as p-type conductivity. The well 12 may be doped to have the same conductivity type as the underlying semiconductor substrate 10 and, in that regard, the well 12 may contain p-type dopant from Group V of the Periodic Table (e.g., boron (B) and/or indium (In)) that provides p-type electrical conductivity. The well 12 may be formed by applying an implantation mask and implanting with ions delivering the p-type dopant under given implantation conditions (e.g., ion species, dose, kinetic energy, implantation angle). To form the well 12, the ions may be generated from a suitable source gas and implanted into the semiconductor substrate 10 with the given implantation conditions using an ion implantation tool. An anneal may be used to activate and/or drive-in the dopants of the well 12.

The well ring 14 may be doped to have an opposite conductivity type from the underlying semiconductor substrate 10 and from the well 12 and, in that regard, may contain an n-type dopant from Group V of the Periodic Table (e.g., phosphorus (P) and/or arsenic (As)) that provides n-type electrical conductivity. The well ring 14 may be formed by applying an implantation mask and implanting with ions delivering the n-type dopant under given implantation conditions (e.g., ion species, dose, kinetic energy, implantation angle). To form the well ring 14, the ions may be generated from a suitable source gas and implanted into the semiconductor substrate 10 with the given implantation conditions using an ion implantation tool. An anneal may be used to activate and/or drive-in the dopants of the well ring 14.

Trench isolation regions 16 are formed that extend from a top surface 11 of the semiconductor substrate 10 to a shallow depth beneath the top surface 11 of the semiconductor substrate 10. The trench isolation regions 16 may be formed by patterning trenches in the semiconductor substrate 10 with a lithography and etching process, filling the trenches with a dielectric material, such as an oxide of silicon (e.g., silicon dioxide ($SiO_2$)), deposited by chemical vapor deposition (CVD), planarizing with chemical mechanical polishing (CMP), and recessing the dielectric material with a de-glaze process. The trench isolation regions 16, which may be trapezoidal in shape, penetrate partially through the well 12 and surround different sections of the well 12 to define distinct active device regions 18. Each of the active device regions 18 includes one of the sections of the well 12.

After forming the trench isolation regions 16, a deep well 20 may be formed beneath the well 12 and may be coupled physically and electrically at its outer edge with the well ring 14. The well 12 is arranged in a vertical direction between the deep well 20 and the top surface 11 of the semiconductor substrate 10. The deep well 20 may be doped to have an opposite conductivity type from the underlying semiconductor substrate 10 and an opposite conductivity type from the well 12, and the same conductivity type as the well ring 14. In an embodiment, the deep well 20 may contain an n-type dopant from Group V of the Periodic Table (e.g., phosphorus (P) and/or arsenic (As)) that provides n-type electrical conductivity. The deep well 20 may be formed by applying an implantation mask and implanting with ions delivering the n-type dopant under given implantation conditions (e.g., ion species, dose, kinetic energy, implantation angle). To form the deep well 20, the ions may be generated from a suitable source gas and implanted into the semiconductor substrate 10 with the given implantation conditions using an ion implantation tool. An anneal may be used to activate and/or drive-in the dopants of the deep well 20.

The deep well 20 may include doped regions 22 arranged beneath the trench isolation regions 16 and doped regions 24 beneath the active device regions 18, and that are formed during the implantation by differences in ion range. The doped regions 22 extend in a vertical direction over a shallower depth than the doped regions 24. More specifically, the doped regions 22 have a given depth profile extending from a depth d1 to a depth d2, and the doped regions 24 have a different depth profile that extends from a depth d3 to a depth d4 and that overlaps in a vertical direction with the depth profile of the doped regions 22. Depths are measured relative to the top surface 11 of the semiconductor substrate 10. The different depth profiles occur because implanted ions penetrating through the trench isolation regions 16 have a shorter range than the implanted ions penetrating through the active device regions 18. The depth d1 characterizing the depth profile of the doped regions 22 is closer to the top surface 11 of the semiconductor substrate 10 than (i.e., is less than) the depth d3 characterizing the depth profile of the doped regions 24. The depth d2 characterizing the depth profile of the doped regions 22 is greater than the depth d3 and less than the depth d4 characterizing the depth profile of the doped regions 24. The doped regions 22 may be formed in a self-aligned manner because of the presence of the trench isolation regions 16, which may be formed before the doped regions 22 are formed.

The doped regions 22 and the doped regions 24, which overlap and are continuous, are connected with the well ring 14. The implantation conditions are controlled such that the doped regions 22 and trench isolation regions 16 overlap in space and/or are in direct contact. As a result of the overlapping relationship and the related boundary sharing, the doped regions 22 and trench isolation regions 16 adjoin and are contiguous in a vertical direction.

Collectively, the doped regions 22, 24 of the deep well 20 and the trench isolation regions 16 cooperate to individually and fully isolate each individual section of the well 12 defining one of the active device regions 18. This individualized isolation of the active device regions 18 by the doped regions 22, 24 of the deep well 20 and the trench isolation regions 16 contrasts with conventional structures in which portions of the well are arranged between the deep well and the bottoms of the shallow trench isolation regions and, as a result, all of the active device regions are effectively arranged in a single large well. Large conventional wells have a significant well-substrate capacitance, which tends to degrade figures of merit (e.g., increase the off capacitance) of field-effect transistors formed using such a single large well. In addition, the single large well is connected with the highest circuit potential.

Figure 3:
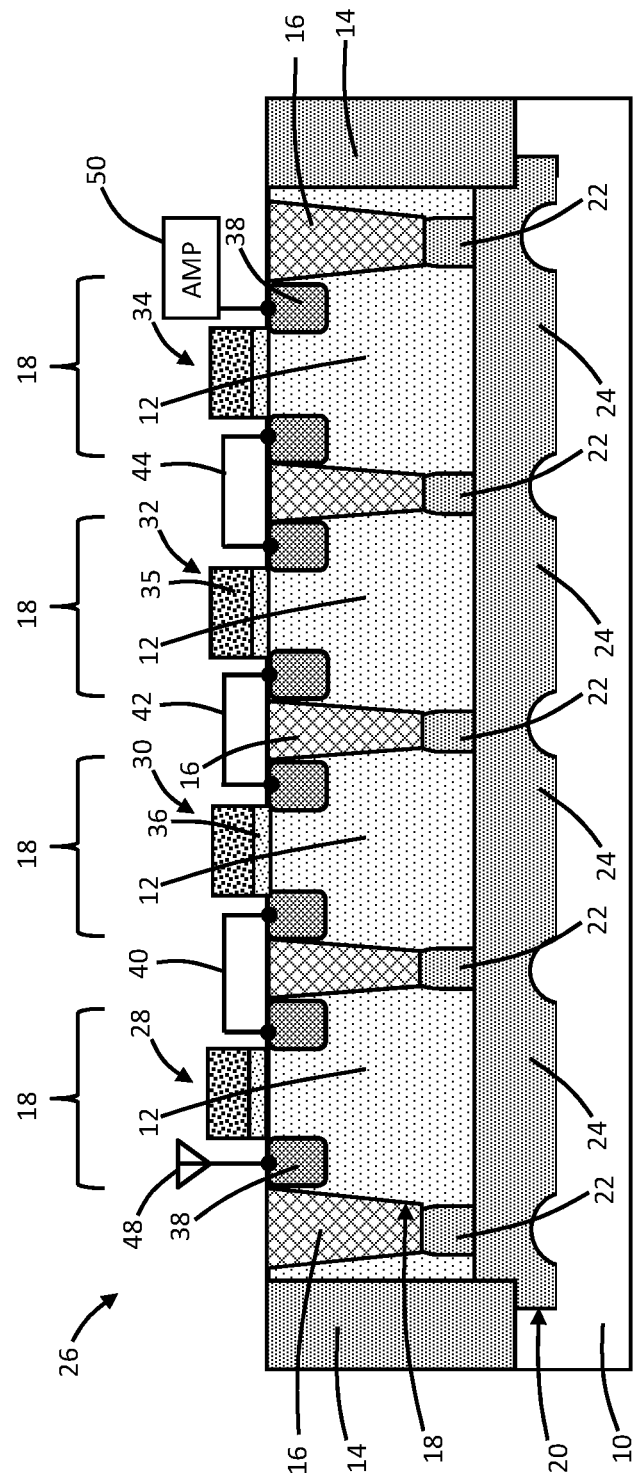
FIG. 3 is a cross-sectional view of the structure at a subsequent stage of the processing method.

With reference to FIG. 3 in which like reference numerals refer to like features in FIG. 2 and at a subsequent fabrication stage, a device structure 26 is formed using the active device regions 18 by front-end-of-line (FEOL) fabrication processes. The device structure 26 includes multiple active devices that are arranged in the active device regions 18. In an embodiment, the device structure 26 may be a switch that includes multiple field-effect transistors 28, 30, 32, 34 provided as active devices in the active device regions 18. In the representative embodiment, one of the field-effect transistors 28, 30, 32, 34 is provided in each of the active device regions 18, although the embodiments of the invention are not so limited.

Each of the field-effect transistors 28, 30, 32, 34 includes a gate electrode 35 and a gate dielectric 36 that may be formed by depositing a layer stack and patterning the layer stack with photolithography and etching. The gate electrode 35 may be composed of a conductor, such as doped polycrystalline silicon (i.e., polysilicon), and the gate dielectric 36 may be composed of an electrical insulator, such as silicon dioxide ($SiO_2$). The field-effect transistors 28 may include other structural elements, such as source/drain regions 38, halo regions, and lightly doped drain (LDD) extensions in the active region, as well as non-conductive spacers formed on the vertical sidewalls of the gate electrodes 35. In an embodiment, the source/drain regions 38 may contain an n-type dopant (e.g., arsenic (As) or phosphorus (P)) selected from Group V of the Periodic Table to produce n-type conductivity. As used herein, the term "source/drain region" connotes a doped region of semiconductor material that can function as either a source or a drain of a field-effect transistor. In the representative embodiment, each section of the well 12 provides a body for one of the field-effect transistors 28, 30 32, 34.

Middle-of-line (MOL) and back-end-of-line (BEOL) processing follow, which includes formation of an interconnect structure that includes one or more interlayer dielectric layers that are formed over the semiconductor substrate 10 and metallization formed in the interlayer dielectric layers. The interconnect structure may include wires and contacts that form an interconnect 40 coupling one of the source/drain regions 38 of the field-effect transistor 28 with one of the source/drain regions 38 of the field-effect transistor 30, an interconnect 42 coupling the other source/drain region 38 of the field-effect transistor 30 with one of the source/drain regions 38 of the field-effect transistor 32, and an interconnect 44 coupling the other source/drain region 38 of the field-effect transistor 32 with one of the source/drain regions 38 of the field-effect transistor 34. The other source/drain region 38 of the field-effect transistor 34 is connected with ground. The field-effect transistors 28, 30, 32, 34 are stacked in a cascade configuration by this serially-connected arrangement, which enhances power handling during operation of the device structure 26. In particular, the breakdown voltage of the device structure 26 is equal to the total of the individual breakdown voltages of field-effect transistors 28, 30, 32, 34.

The metallization providing the interconnects 40, 42, 44 may include wires that are formed in trenches defined in the one or more interlayer dielectric layers and contacts that are formed in openings defined in the one or more interlayer dielectric layers. The wires of the interconnect structure may be composed of a metal, such as copper (Cu) or cobalt (Co), that is deposited in the trenches by, for example, electroless or electrolytic deposition. The contacts of the interconnect structure may be composed of a metal, such as tungsten (W), that is deposited in the trenches by, for example, chemical vapor deposition (CVD).

In embodiments, the device structure 26 may couple an antenna 48 with an amplifier 50, such as a low noise amplifier or a power amplifier, for the transfer of signals either to the amplifier 50 from the antenna 48 or from the antenna 48 to the amplifier 50. Because of the individualized electrical isolation afforded the active device regions 18 by the combination of the doped regions 22, 24 of the deep well 20 and the trench isolation regions 16, a fixed amount of voltage (e.g., 3 volts) is dropped across each of the active device regions 18 during operation to provide an enhanced total breakdown voltage. For example, the field-effect transistors 28, 30, 32, 34 may be effective to operate as a switch with a total breakdown voltage exceeding twelve (12) volts, and a voltage of twelve (12) volts for a signal input at the field-effect transistor 28 may be dropped to a voltage of three (3) volts for the signal output from the field-effect transistor 34. The number of isolated active device regions 18 and field-effect transistors 28, 30, 32, 34 may vary contingent upon the voltage level of the input signal that is to be dropped. For example, an operating voltage greater than twelve (12) volts will require additional field-effect transistors 28, 30, 32, 34 and/or isolated active device regions 18 each capable of dropping a fixed voltage of three (3) volts in order to provide adequate high-voltage isolation. In that regard, the number of isolated active device regions 18 and field-effect transistors 28, 30, 32, 34 may provide a total breakdown voltage that is greater than forty (40) volts for commensurate operating voltages. In addition, the deep well 20 may reduce the effect of the back gate in the semiconductor substrate 10 beneath the deep well 20 from influencing the operation of the field-effect transistors 28, 30, 32, 34.

Figure 4:
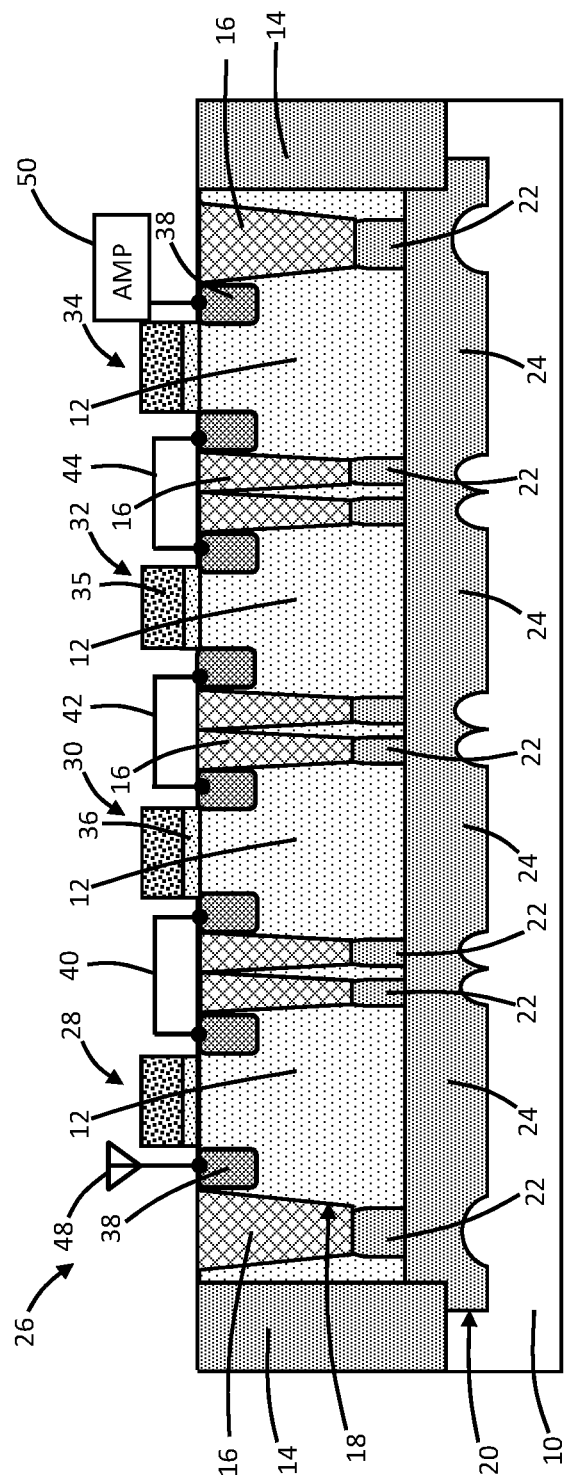
FIGS. 4-6 are cross-sectional views similar to FIG. 3 of structures in accordance with alternative embodiments of the invention.

With reference to FIG. 4 in which like reference numerals refer to like features in FIG. 3 and in accordance with alternative embodiments of the invention, multiple trench isolation regions 16 may be arranged laterally between each of the active device regions 18. Each of the multiple trench isolation regions 16 adjoin and are contiguous in a vertical direction with one of the regions 22 of the deep well 20. This double isolation scheme may permit higher operating voltages for the device structure 26.

Figure 5:
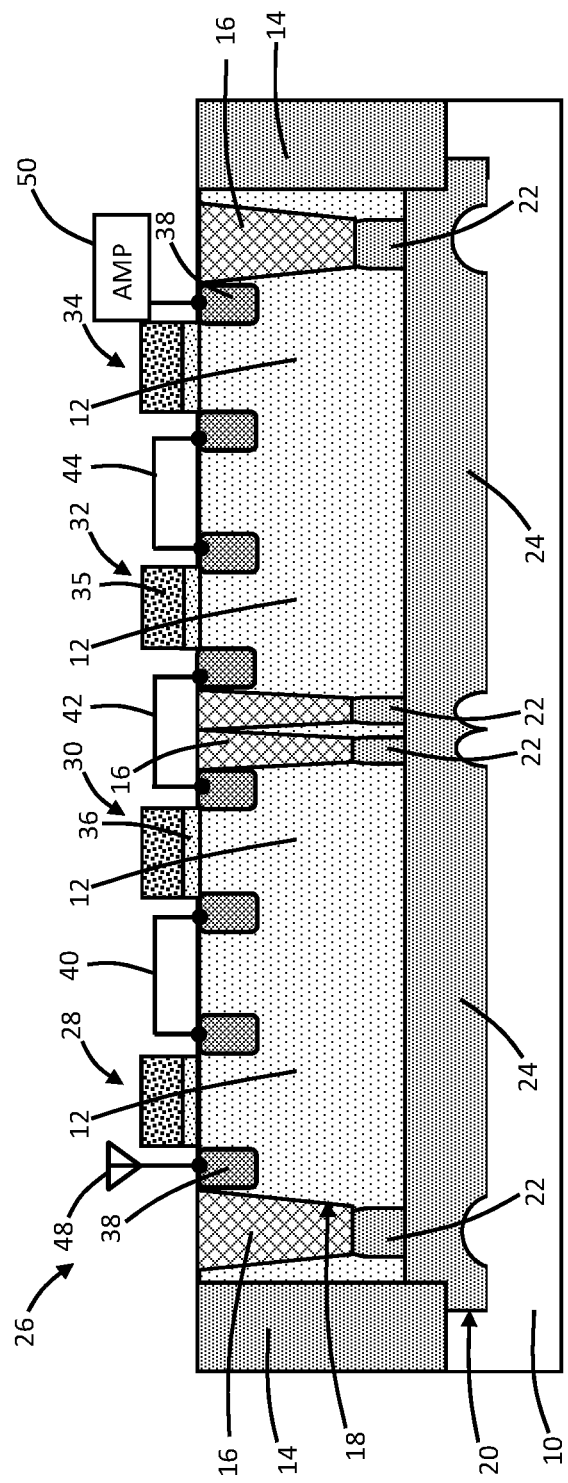

With reference to FIG. 5 in which like reference numerals refer to like features in FIG. 3 and in accordance with alternative embodiments of the invention, two or more of the field-effect transistors 28, 30, 32, 34 may be arranged in each of the active device regions 18 such that each active device region 18 includes multiple field-effect transistors 28, 30, 32, 34. For example, the field-effect transistors 28, 30 may be arranged in one of the active device regions 18 and the field-effect transistors 32, 34 may be arranged in another of the active device regions 18. This increase in packing density may enable a more compact design for the device structure 26.

Figure 6:
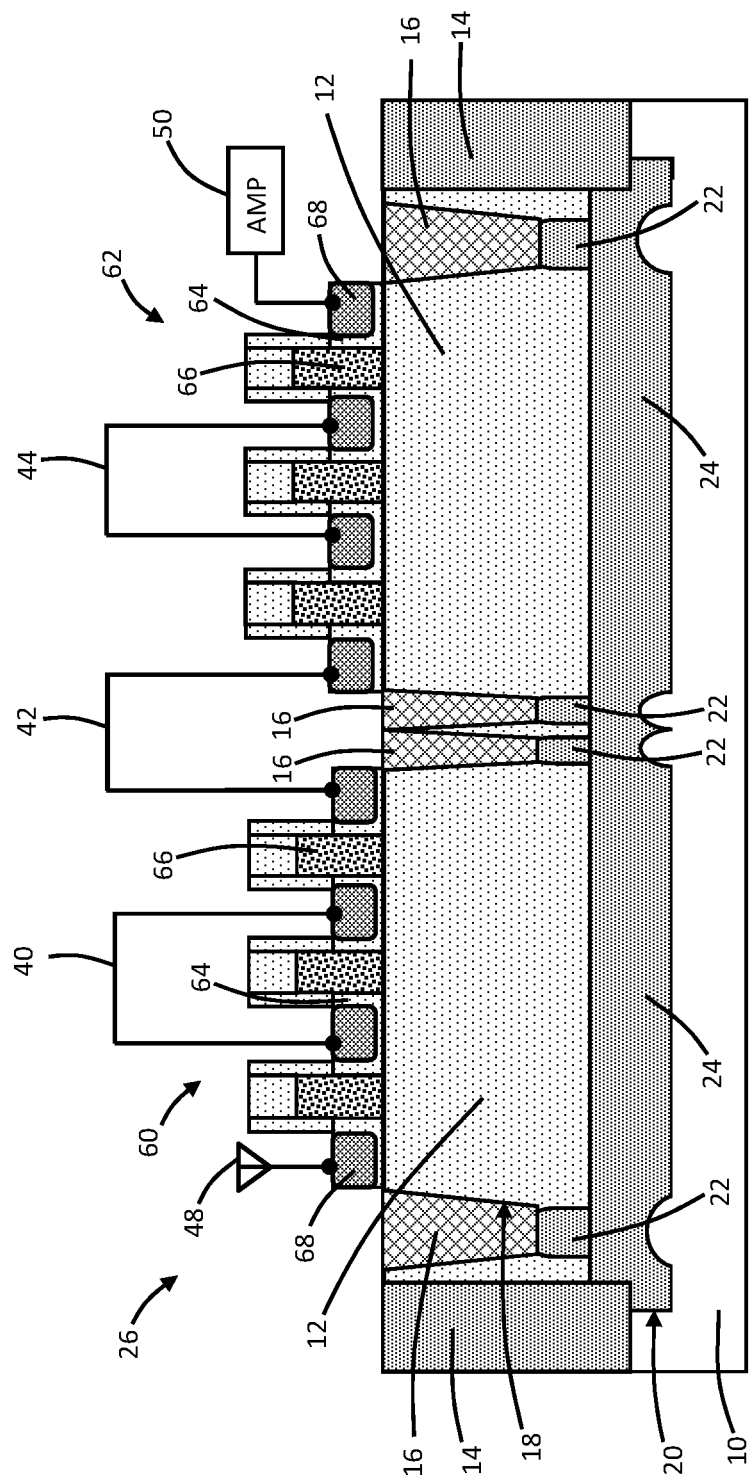

With reference to FIG. 6 in which like reference numerals refer to like features in FIG. 3 and in accordance with alternative embodiments of the invention, the planar field-effect transistors 28, 30, 32, 34 of the device structure 26 may be replaced by fin-type field-effect transistors 60, 62. Each of the fin-type field-effect transistors 60, 62 may be formed using one or more fins 64 that extend vertically from the semiconductor substrate 10. The fins 64 may be formed from a semiconductor material, such as an epitaxial layer of semiconductor material grown on the semiconductor substrate 10 that is patterned by self-aligned double patterning (SADP) or self-aligned quadruple patterning (SAQP) and cut into given lengths in the layout associated with the specific device structure 26 being formed.

Each of the fin-type field-effect transistors 60, 62 includes a gate structure 66 that overlaps with the one or more fins 64. The gate structure 66 may include a gate electrode and a gate dielectric that may be formed by depositing a layer stack and patterning the layer stack with photolithography and etching. The gate electrode of the gate structure 66 may be composed of a conductor, such as doped polycrystalline silicon (i.e., polysilicon), and the gate dielectric of the gate structure 66 may be composed of an electrical insulator, such as silicon dioxide ($SiO_2$). The fin-type field-effect transistors 60, 62 may include source/drain regions 68 composed of a semiconductor material formed by an epitaxial growth process. In an embodiment, the source/drain regions 68 may contain an n-type dopant (e.g., arsenic (As) or phosphorus (P)) selected from Group V of the Periodic Table to produce n-type conductivity.

In alternative embodiments, the device structure 26 may be constructed using other types of transistors, such as heterojunction bipolar transistors, nanosheet field-effect transistors, etc.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first well in a substrate;
a first active device region including a first section of the first well;
a second active device region including a second section of the first well;
a first trench isolation region in the substrate, the first trench isolation region laterally positioned between the first active device region and the second active device region, and the first trench isolation region extending partially through the first well; and
a second well in the substrate, the second well having an opposite conductivity type from the first well,
wherein the first active device region, the second active device region, and the first trench isolation region are arranged between a top surface of the substrate and the second well, the second well is located beneath the first well and the first trench isolation region, and the second well is in part contiguous with the first trench isolation region.

2. The structure of claim 1 further comprising:
a device structure including a first active device arranged in the first active device region and a second active device arranged in the second active device region.

3. The structure of claim 2 wherein the first active device is a first planar field-effect transistor having a first source/drain region, and the second active device is a second planar field-effect transistor having a second source/drain region that is coupled in series with the first source/drain region in a cascaded arrangement.

4. The structure of claim 2 wherein the first active device is a first fin-type field-effect transistor having a first source/drain region, and the second active device is a second fin-type field-effect transistor having a second source/drain region that is coupled in series with the first source/drain region in a cascaded arrangement.

5. The structure of claim 2 wherein the first active device is a first field-effect transistor having a first source/drain region, and the second active device is a second field-effect transistor having a second source/drain region that is coupled in series with the first source/drain region in a cascaded arrangement.

6. The structure of claim 5 wherein the first field-effect transistor and the second field-effect transistor have respective breakdown voltages that are summed due to the cascaded arrangement.

7. The structure of claim 2 further comprising:
an antenna; and
an amplifier coupled by the device structure with the antenna.

8. The structure of claim 1 further comprising:
a second trench isolation region arranged between the first trench isolation region and the first active device region,
wherein the first trench isolation region extends partially through the first well, the first trench isolation region is arranged between the top surface of the substrate and the second well, and the second well is located beneath the first well and the first trench isolation region.

9. The structure of claim 1 further comprising:
a device structure including a first active device and a second active device arranged in the second active device region.

10. The structure of claim 9 further comprising:
a second trench isolation region arranged between the first trench isolation region and the first active device region.

11. A method comprising:
forming a first well in a substrate;
forming a first trench isolation region in the substrate; and
after forming the first trench isolation region in the substrate, implanting the substrate with ions to form a second well having an opposite conductivity type from the first well,
wherein the first well includes a first section defining a first active device region and a second section defining a second active device region, the first trench isolation region is laterally positioned between the first active device region and the second active device region, the first active device region, the second active device region, and the first trench isolation region are arranged between a top surface of the substrate and the second well, the first trench isolation region extends partially through the first well, the second well is located beneath the first well and the first trench isolation region, and the second well is in part contiguous with the first trench isolation region.

12. The method of claim 11 further comprising:
forming a device structure including a first active device arranged in the first active device region and a second active device arranged in the second active device region.

13. The method of claim 12 wherein the first active device is a first field-effect transistor having a first source/drain region, and the second active device is a second field-effect transistor having a second source/drain region that is coupled in series with the first source/drain region in a cascaded arrangement.

14. The method of claim 11 further comprising:
forming a second trench isolation arranged between the first trench isolation region and the first active device region,
wherein the first trench isolation region extends partially through the first well, the first trench isolation region is arranged between the top surface of the substrate and the second well, and the second well is located beneath the first well and the first trench isolation region.

15. The method of claim 11 further comprising:
forming a device structure including a first active device in the first active device region and a second active device the second active device region; and
forming a second trench isolation region arranged between the first trench isolation region and the first active device region.

16. The structure of claim 9 wherein the device structure has a total breakdown voltage that is greater than forty (40) volts.

17. The structure of claim 1 wherein the second well includes a first region beneath the first active device region and a second region that is contiguous with the first trench isolation region.

18. The method of claim 11 wherein the second well includes a first region beneath the first active device region and a second region that is contiguous with the first trench isolation region.

19. The structure of claim 17 wherein the first region has a first depth profile, the second region has a second depth profile, the first depth profile extends to a first depth in the substrate, and the second depth profile extends to a second depth that is less than the first depth.

20. The method of claim 18 wherein the first region has a first depth profile, the second region has a second depth profile, the first depth profile extends to a first depth in the substrate, and the second depth profile extends to a second depth that is less than the first depth.

* * * * *